United States Patent [19]

Simmons et al.

[11] Patent Number: 5,797,177
[45] Date of Patent: Aug. 25, 1998

[54] INSERTION TOOL FOR PRINTED CIRCUIT BOARD ELECTRICAL CONNECTORS

[75] Inventors: Robert M. Simmons, Winston-Salem, N.C.; Brian L. Thomason, Danville, Va.

[73] Assignee: The Whitaker Corporation, Wilmington, Del.

[21] Appl. No.: 590,307

[22] Filed: Jan. 23, 1996

[51] Int. Cl.⁶ .................................................. B23P 19/00
[52] U.S. Cl. .................................................. 29/739
[58] Field of Search .................................. 29/739, 741

[56] References Cited

U.S. PATENT DOCUMENTS

| | | | |
|---|---|---|---|
| 3,535,763 | 10/1970 | Helton | 29/203 |
| 3,559,267 | 2/1971 | Castellani | 29/739 |
| 3,797,092 | 3/1974 | Einarson | 29/741 |
| 3,896,533 | 7/1975 | Ullman et al. | 29/203 R |
| 4,127,063 | 11/1978 | Peterson et al. | 101/3 R |
| 4,172,317 | 10/1979 | Kober et al. | 29/566 |
| 4,461,073 | 7/1984 | Harringer et al. | 29/741 |
| 4,744,140 | 5/1988 | Bright | 29/741 |
| 4,800,647 | 1/1989 | Guyer | 29/741 |
| 4,847,990 | 7/1989 | Patrick | 29/741 |
| 4,868,975 | 9/1989 | Zaremba et al. | 29/741 |
| 4,873,761 | 10/1989 | Korsunsky et al. | 29/741 |
| 5,058,264 | 10/1991 | Quach | 29/741 |
| 5,074,030 | 12/1991 | Anderson et al. | 29/739 |
| 5,307,741 | 5/1994 | Clark et al. | 101/405 |
| 5,365,653 | 11/1994 | Padrum | 29/741 |

OTHER PUBLICATIONS

AMP Instruction Sheet is 9413, AMP Micro–Edge SIMM Connector Module Board Insertion and Removal Procedures, Released Jul. 18, 1991.
General Hardware Manufacturing Catalog p. 1417.
AMP Instruction Sheet is 9141, AMP Alignment Tools for AMP–HDI PC Board Connectors, Released Jan. 19, 1990.
AMP Instruction Sheet is 2636, AMP Contact Replacement Tool 265871–[ ] for Action Pin Contacts, Released Sep. 4, 1990.
Western Electric publication No. S04560004 by Camp et al, Apr. 1980.

*Primary Examiner*—Carl E. Hall
*Assistant Examiner*—Christopher Goins

[57] ABSTRACT

A tool 2 used to position a socket 100 on a printed circuit board 200 includes an insertion head 10 and an inertial impact mechanism. A socket, such as SIMM socket 100, is mounted on the insertion head with the lower surface of arms 14 on the insertion head conforming to the upper surface of the socket. A shaft 42 connects the insertion head to the inertial impact mechanism and the shaft is positioned in alignment with a mechanical retention post 110 on the socket. The impact delivered by the tool pushes the retention post 110 into an interference fit with a corresponding hole 204 on the printed circuit board. The insertion head arms 14 includes a rib 34 that overlaps contact terminals 130 in the socket to prevent the terminals 130 from being forced out of the socket when the socket is secured to the printed circuit board. The inertial impact mechanism includes a spring loaded hammer mass 48 of the type used for a center punch.

9 Claims, 7 Drawing Sheets

INSERTION TOOL FOR PRINTED CIRCUIT BOARD ELECTRICAL CONNECTORS

BACKGROUND OF THE INVENTION

1. Field of the Invention

This invention is generally related to apparatus to be used in the assembly of a generally planar, nonconductive member having or to be provided with paths of conductive material to an electrical component having more than one electrical connection, such that the component can be electrically secured to multiple conductive paths. More specifically, this invention is related to the placement of components, such as electrical connectors, having multiple terminals on printed circuit boards. Even more specifically, this invention is related to the placement of components with multiple terminal leads in through holes on a printed circuit board. A tool for inserting components, such as electrical connectors, onto printed circuit boards and a method of using such tools are the subjects of this invention.

2. Description of the Prior Art

Multiposition electrical connectors or sockets are commonly employed to connect active electronic devices, such as integrated circuit components or memory modules, to a printed circuit board. Perhaps the most common examples are the sockets used to mount dual inline packages or DIPs to printed circuit boards. DIP's and other similar packages and sockets have multiple terminals located in one or more rows. The most common packages and sockets, at least when viewed historically, have terminals with through hole leads that extend from the bottom of the package or socket. These leads are inserted in plated through holes located in a corresponding pattern on a printed circuit board or through holes in a single sided printed circuit board. Other electrical connectors with similar through hole lead configurations include, among others, sockets for use with other types of integrated circuit devices, input/output connectors, connectors for connecting daughter boards to mother boards, and connectors for use with memory modules containing multiple chips located on a separate circuit board having contact pads located on one edge of the separate printed circuit board.

These through hole components can be mounted on printed circuit boards using a number of techniques. Automatic assembly machines are available for many standard components, including DIP's and robotic assembly is also possible. Specialized insertion equipment for specific components is available and pick and place equipment can also be used. Components and sockets having a large number of through hole leads do pose problems for automatic assembly, in part because of the need to precisely position the leads prior to insertion in circuit board holes. For machine-insertable parts it is best if all of the leads are outside the shadow of the body when seen from above. Leads of this type can then be inserted by grooved hard tooling that is used to guide the leads into the printed circuit board holes. For example, forming combs can be used with DIP's. For components with many leads within the shadow of the body several different approaches can be used. If the lead tip to tip dimensions and tolerances and hole dimensions and tolerances are sufficient to preclude interference in even the worst case, the component can be repositioned on a vacuum-tipped placement head using the leads as a reference and the part can be inserted by moving the head down to the board. These tip to tip tolerances cannot always be maintained, especially for components having a large number of side-by-side leads in a row where tolerance build up can be a problem. Another approach is to use pivoted grooved tooling that wraps around the lower portion of the component to guide the leads into the printed circuit board holes. However, for this approach the tooling must be spread apart after insertion to clear the components. The need to spread the tooling during withdrawal places restrictions on the side-to-side placement density for the components or sockets. In applications where printed circuit board real estate is at a premium and close component spacing is necessary, this latter approach may not be acceptable.

In many cases hand assembly is used and there are a number of prior art tools for aiding hand assembly of leaded components. Although manual insertion of leaded components may be slower than automatic insertion is some cases, the installer can often physically align the leads with corresponding printed circuit board holes more reliably than is possible with machine insertion. A number of prior art hand insertion tools are available for use with integrated circuit components because these components can be damaged if touched and inserted directly by hand. Although hand tools of this type can conceptually be used to insert sockets and electrical connectors, there are at least two drawbacks. As with machine fixtures, many hand tools include pivoted gripping elements that spread outward for retraction. This can restrict the placement of sockets and connectors in densely packed printed circuit boards. In addition, sockets- and electrical connectors must typically be mechanically secured to the printed circuit boards, at least prior to soldering. Press fit or interference fit mounting posts, boardlocks, or other holddown or retention members are typically used to mechanically secure electrical connectors and sockets to printed circuit boards. A force must then be applied to the connector or socket to insert the mounting posts into a mounting hole in the printed circuit board.

One problem that is common to both machine assembly and to hand assembly is that the leads on connectors and sockets can be bent either during manufacture, shipping, assembly or during handling. Even if the leads were originally within acceptable dimensional tolerances, a lead that has been sufficiently bent cannot be inserted into its corresponding printed circuit board hole. Often components are mounted with bent leads that are only discovered during testing. Diagnostic procedures are necessary to locate the damaged component and in some cases the defective part can be replaced. Such rework is expensive and for heavily populated printed circuit boards with numerous components, rework of this type can occur too frequently. In some cases the entire board assembly must be scrapped.

These assembly problems are generic to most printed circuit board electrical connectors and sockets. All of these assembly problems are common to sockets used to mount inline memory modules, such as single inline memory modules or SIMM's. These SIMM sockets typically have a large number of leaded contacts mounted in rows. For example, a seventy-two position SIMM socket with offset leads in two staggered rows of thirty six on adjacent centerlines of 0.050 inch is common. If one of these leads is bent and undiscovered prior to soldering, the entire connector must be replaced.

One SIMM socket uses guide pins on opposite ends of the socket to initially position the leads relative to corresponding printed circuit board holes. After the leads initially enter the holes, a center mounting post is forced into an interference fit with a hole located in the center of the pattern of holes for mounting one SIMM socket. The prescribed method of mounting this SIMM socket by hand is to first align the outer pins with the holes and then to insert longer terminal leads in one row into corresponding holes. The socket is then rotated about its lengthwise axis to bring a second row of staggered lead into alignment with a second row of holes. With the leads aligned with their corresponding holes, force is then applied to the center retention post to mechanically secure the socket to the printed circuit board. Unfortunately this prescribed hand assembly method is often not employed. Installers typically insert the guide pin on one end of the socket first and then rotate the connector about an axis perpendicular to the terminal row until the terminals and then the second guide pin are aligned. This approach defeats the purpose of initially inserting both longer guide pins before inserting the terminal leads. More leads are damaged in this way, resulting in more defective assemblies. When pressing sockets of this type into engagement with a printed circuit board by hand, installers often bend the printed circuit board further aggravating misalignment problems. Perhaps even more detrimental is that bending the printed circuit board in this manner can also damage the board and other relatively more expensive components on the board. In addition, this prior art socket employs terminals that are loaded in housing cavities from the top of the socket housing. These top loaded sockets have several advantages, such as preventing solder wicking into the contact area of the terminals and ease of assembly. However, if the terminal lead is not properly aligned with its corresponding printed circuit board hole, the terminal can be forced out of its housing cavity when the socket is properly seated on the printed circuit board.

SUMMARY OF THE INVENTION

The simple insertion tool and method that is the subject of this invention overcomes these and other problems with prior art assembly tools and methods. This tool is easy to use and makes it difficult for the installer to improperly install the socket or connector. Furthermore this simple hand tool is inexpensive to manufacture and is reliable and durable. The hand tool version uses a simple insertion head secured to a standard spring operated inertial impact tool or automatic center punch. In the preferred embodiment a steel body center punch is used. The punch shaft is replaced with a shaft for mounting the insertion head on the tool mechanism. Preferably the punch tip or shaft is modified so that the insertion head can be mounted to the operative end. This inertial mechanism provides the installer with tactile feel so that the installer can detect misaligned terminal leads before pushing the mounting retention post into an interference fit with the printed circuit board. The inertial impact mechanism then delivers an impact force to the insertion head and to the socket at the end of the insertion stroke so that the socket can be reliably mechanically secured to the printed circuit board.

The insertion head mounted on the shaft of the inertial impact mechanism has a lower surface that is positioned along the upper surface of the connector. The shaft of the tool is aligned with the mounting post or retention member on the socket so that the impact force delivered by the tool is in alignment with the mounting post. The insertion head comprises a bar that extends laterally on opposite sides of the shaft. When used with a connector or socket having top loaded contacts, the insertion head includes a rib that is aligned with the contacts to prevent them from being pushed out of the socket housing. In the preferred embodiment, the socket is held in contact with the insertion head by a spring loaded clip that is opposed to a lip on the opposite side of the insertion head.

The socket is picked up or inserted in the insertion tool and held by the spring loaded clip. In the preferred embodiment, the insertion tool head includes laterally protruding wings that serve as an orientation feature. When used with a socket having offset upright support members on both ends, the wings allow the socket to fit in the insertion head in only one orientation. The insertion tool is then used to position the socket above a pattern of printed circuit board holes and the socket is the vertically inserted into engagement with the holes. This vertical insertion allows the socket to be placed in close proximity to other sockets or components on the printed circuit board. The tool also allows the installer detect by feel if the socket and the leads are properly aligned before applying an insertion force to the handle of the tool. Telescoping movement of the handle eventually releases a mass to apply an impact to the tool shaft and to the socket to insure that the mechanical retention feature properly engages the printed circuit board.

BRIEF DESCRIPTION OF THE DRAWINGS

FIG. 3 is a front view of the insertion tool with an electrical connector and a printed circuit board shown in relation to the insertion tool.

FIG. 7 is a partial view of the top of the electrical connector shown in FIG. 6. FIGS. 6 and 7 shown the same portion of the electrical connector.

DETAILED DESCRIPTION OF THE PREFERRED EMBODIMENT

The preferred embodiment of the insertion tool depicted herein is specifically intended for use with a single row single inline memory module socket or SIMM socket. The preferred embodiment is also a hand tool intended to be used in mounting these sockets one-at-a-time on a printed circuit board. However, the invention is not limited to the hand tool embodiment or to use with only SIMM sockets or with single row SIMM sockets. For example other embodiments of this tool could be used with a daughter board connector and one of ordinary skill in the art could modify this tool for use with an insertion machine or with pick and place equipment.

Figure 1:
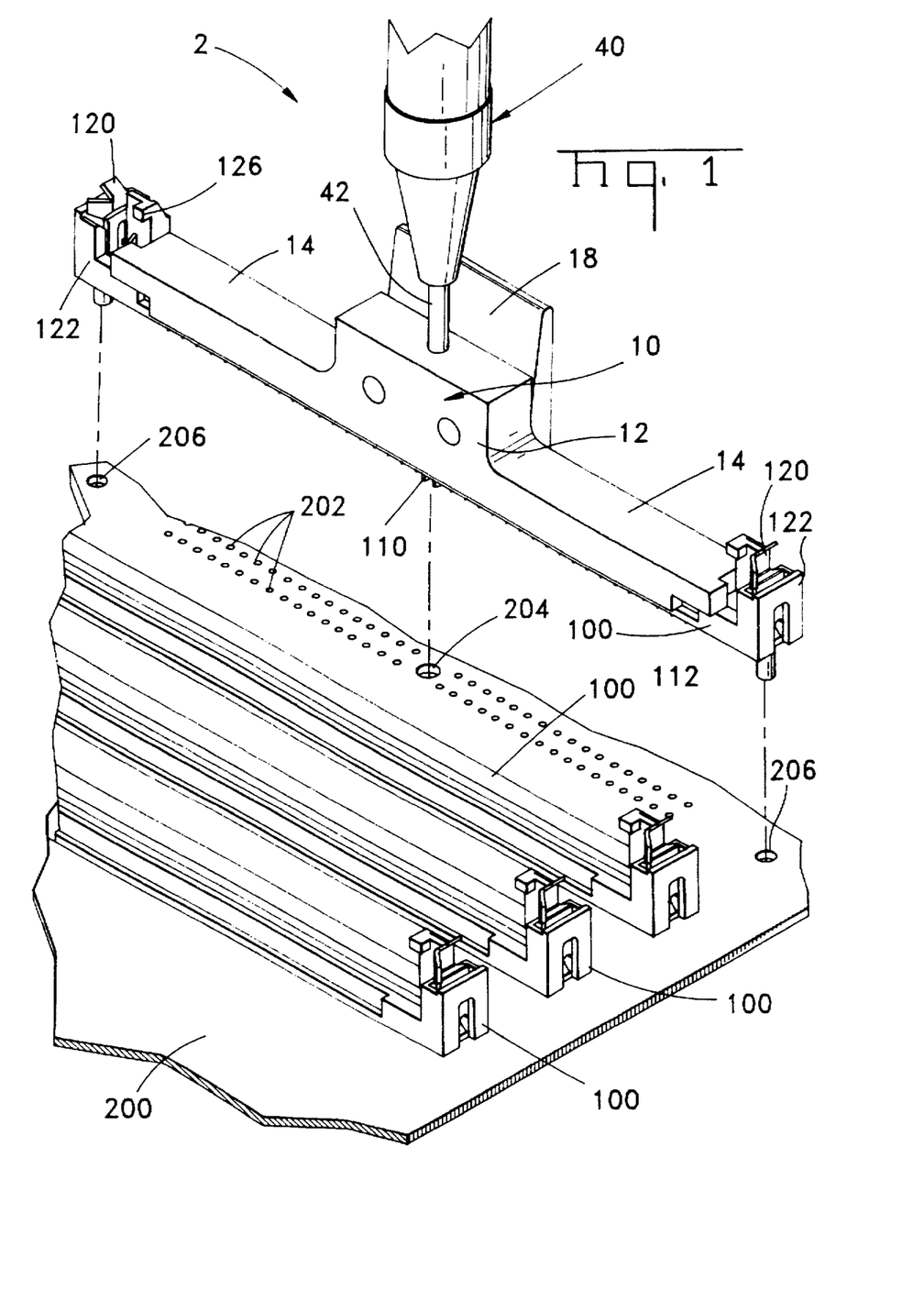
FIG. 1 is a perspective view of an insertion tool being used to position an electrical connector in alignment with a pattern of holes in a printed circuit board.

Insertion tool 2 is shown in FIG. 1 with a SIMM socket 100 held in the tool as the tool is used to position the socket next to three other SIMM sockets 100 mounted on a printed circuit board 200. The configuration of FIG. 1 is typical of a motherboard used in a computer employing a number of closely spaced sockets 100.

The insertion tool 2 comprises an insertion head 10 mounted on an inertial impact tool 40 by a shaft 42. The preferred embodiment of the inertial impact tool 40 is a standard commercially available automatic center punch in which the tool shaft has been replace by a shaft 42 adapted for mounting the insertion head 10 or in which the tip has been modified to accept a threaded adapter 30. The preferred embodiment of this tool is a commercially available center punch manufactured by General Hardware Mfg. Inc. of New York and identified as Model No. 78.

Insertion head 10 comprises a bar of generally rectangular cross section to which a mounting clip 18 is attached. A mounting base 12 is located at the center of the insertion head 10 and two support arms 14 extend laterally outward from the mounting base 12. Mounting base 12 and support arms 14 are machined from a single metal bar. Each support arm 14 includes an orientation wing 16 located at its distal end. Wings 16 are offset so that the socket 100 can be positioned in the insertion head 10 only in the orientation shown in FIG. 1.

Figure 2:
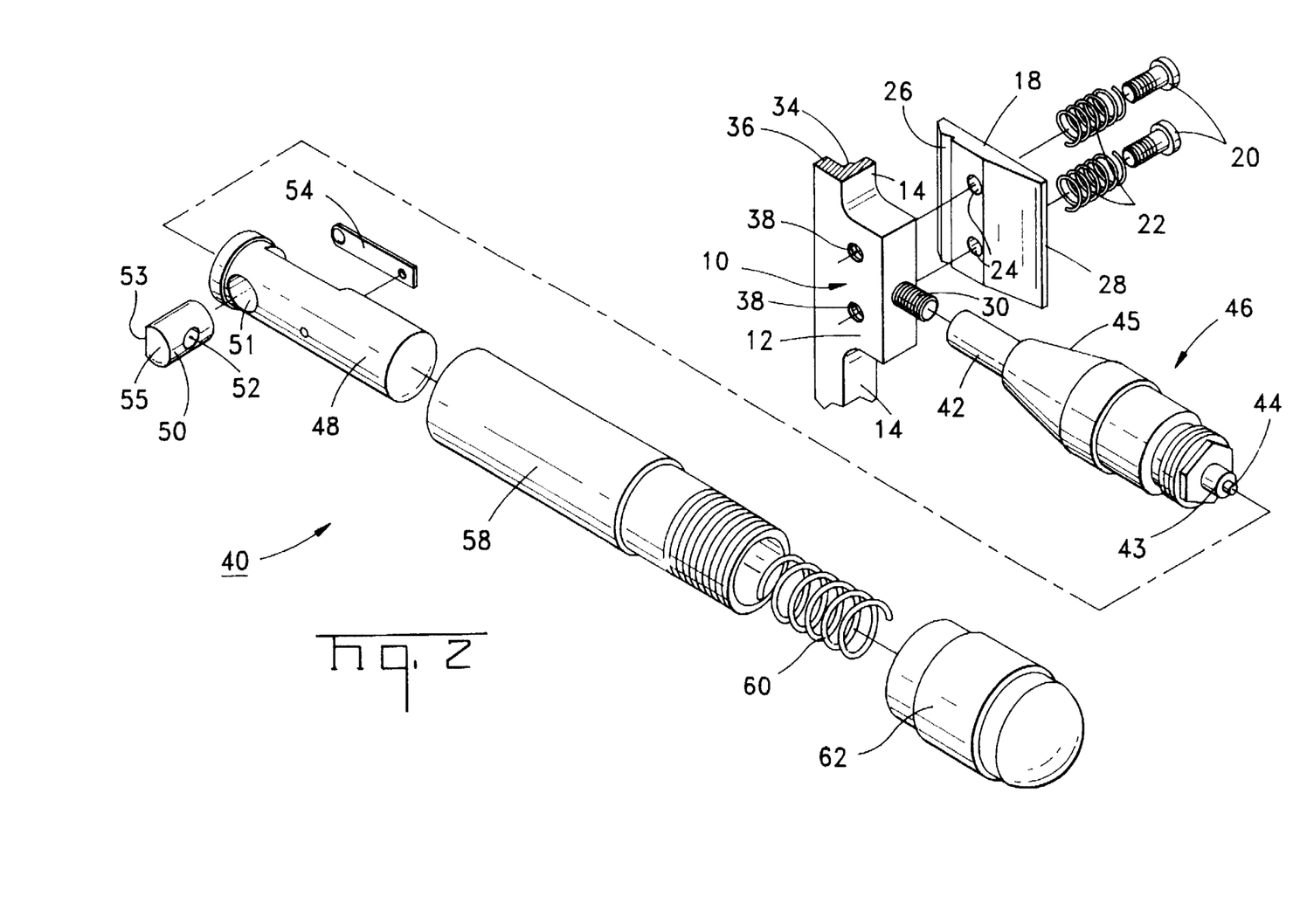
FIG. 2 is an exploded perspective view of the insertion tool.
Figure 4:
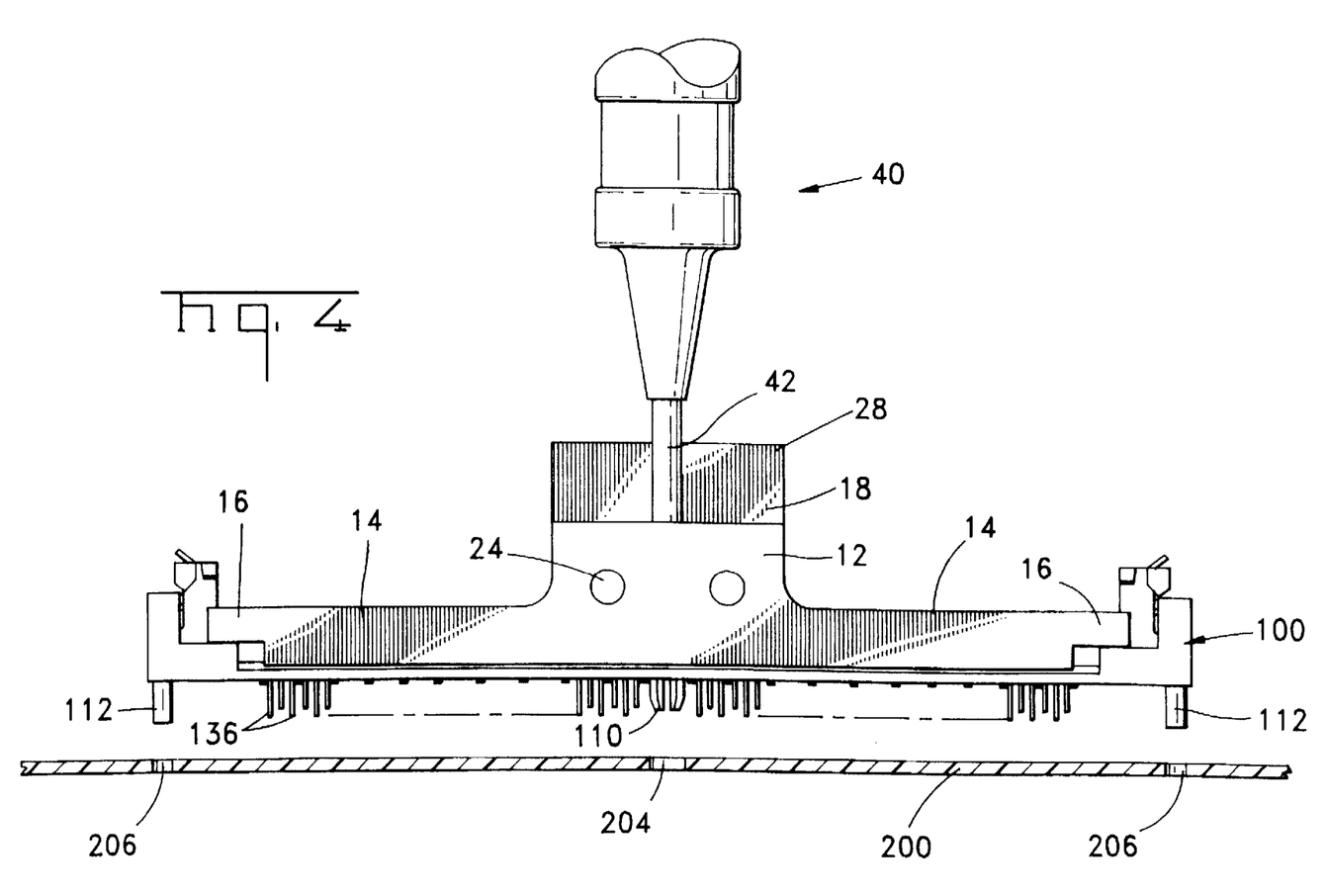
FIG. 4 is a front view showing the electrical connector mounted in the insertion tool just prior to mounting the electrical connector on a printed circuit board.
Figure 5:
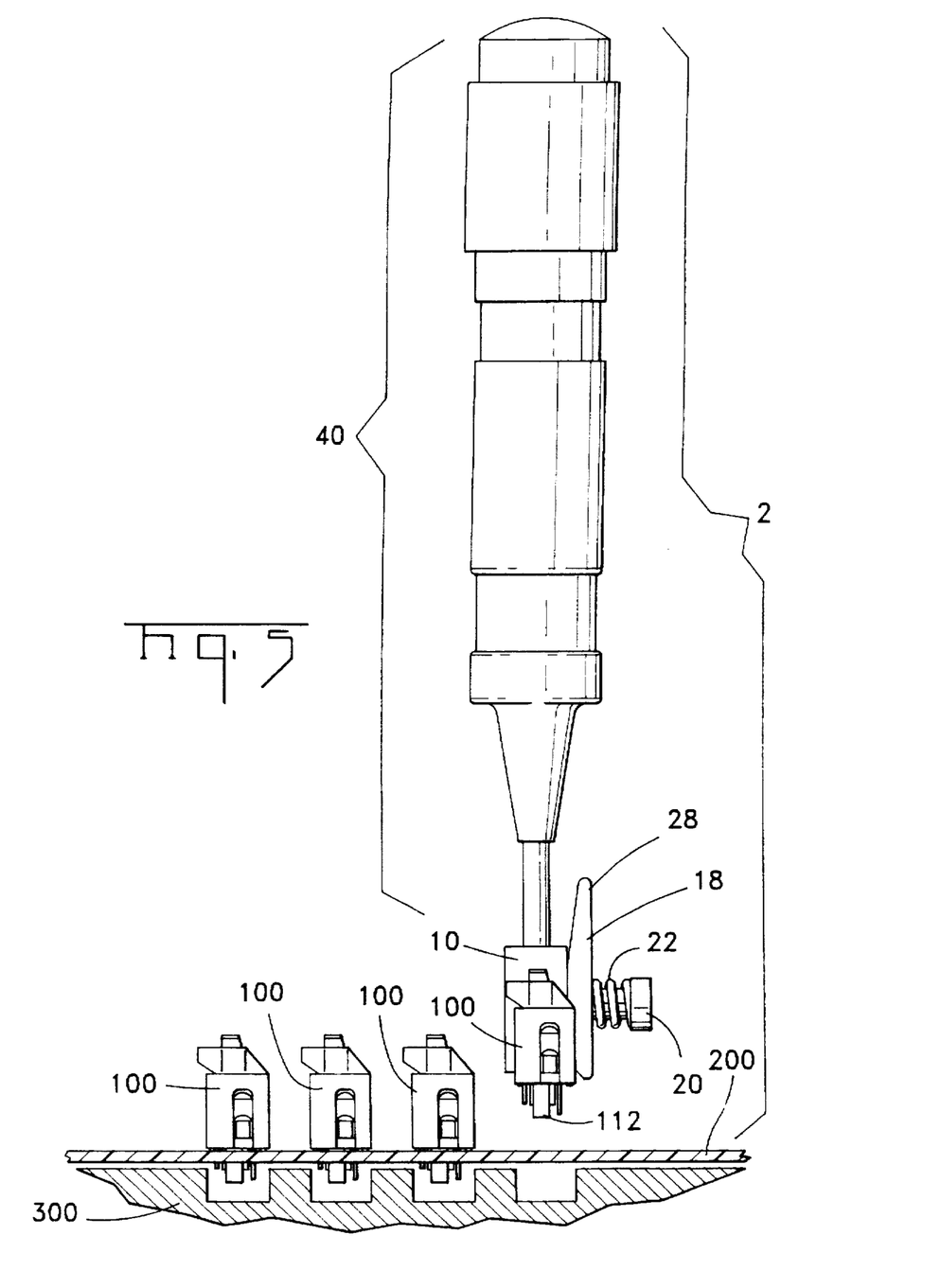
FIG. 5 is a side view of the insertion tool showing the manner in which the insertion tool is used to position an electrical connector or socket next to other connectors mounted on a printed circuit board.

As shown in more detail in FIG. 2, clip 18 is mounted on to the insertion head base 12 by two screws 20 that extend through clip holes 24 into screw holes 38 located in the side of the base 12. Springs 22, located between the head of screws 20 and the base 12, spring load the clip 18 relative to base 12 so that the clip 18 can be pivoted against the action of the springs 22. The clip 18 includes a beveled retention surface 26 located at the bottom and the top portion 28 extends above the point of attachment and is spaced from the base 12 to permit rotational movement. The retention surface 26 is beveled to engage the side of a socket 100. Finger pressure on clip extension 28 will rotate the beveled retention surface 26 away from a socket to release the tool from the socket. A lip 36 extends along the opposite side of the insertion head arms 14 and base 12 to form an surface opposed to clip 18 so that the socket is held between this lip 36 and the portion of the clip 18 containing the beveled retention surface 26. A rib 34 is located on the lower surface of the insertion head 10 and extends between the ends of the support arms 14. This insertion rib 34 is located in a position that will be directly above the terminals located in the socket 100. This relationship will be discussed with reference to the subsequent description of the socket 100.

The mounting base 12 also contains a hole 32 located on the top of the base at the center of the tool. This hole 32 receives the end of a threaded adapter 30 with the shaft 42 attached to the adapter 30 so that the shaft will be positioned directly above the center of the socket 100. As will be subsequently described, a mounting post is located at the center of this socket and the shaft 42 is positioned in alignment with this mounting post.

As previously mentioned, this tool uses a conventional automatic center punch tool 40 to provide the inertial impact mechanism to deliver a force through the shaft 42 to the insertion head 10. Only one commercial center punch tool mechanism is depicted herein. Other conventional center punch tools or inertial impact mechanisms are substantially equivalent to, and could be substituted for, the preferred embodiment shown herein. Although the preferred embodiment of this tool is a hand tool, it should be understood that an inertial impact mechanism of this type could also be incorporated into an assembly machine.

The components of the center punch tool 40 are shown in the exploded view of FIG. 2. The shaft 42 is part of a shaft mounting subassembly 46 and the shaft 42 is spring loaded relative to a conical outer sleeve 45. The upper end of shaft 42 protrudes from the top of this outer sleeve 45 and includes a cylindrical section 43 with a pin 44, of smaller diameter, protruding therefrom.

A piston or hammer 48 is mounted in a cylindrical or tubular outer body 58. This hammer 48 is substantially solid and serves as a mass that can be driven to provide an impact to the shaft 42. A laterally extending cylindrical passage 51 extends through the hammer 48 at its forward end and a plunger 50 is received within this passage 51. Plunger 50 is generally cylindrical but has a flat surface 53 facing the shaft 42. A hole 52 extends through the plunger 50 from the flat surface 53 to the opposite curved side. This hole 52 has an inner diameter that is sufficient to receive the cylindrical upper section 43 of shaft 42. A leaf spring 54 is attached to the side of hammer 48 and this leaf spring 54 biases the plunger 50 to the left as shown in FIG. 2. One end 55 of plunger 50 is rounded and the leaf spring 54 urges this rounded end slightly beyond the end of passage 51.

The hammer 48 resides in the lower portion of the tubular body 58 and a coil spring 60 is trapped within the tubular body 58 between the hammer 48 and a cap 62. This cap 62 is attached to the tubular body by threads on the upper end. The preload on the coil spring 60 is dependent on the position of the cap 62. Thus the preload force exerted by the spring 60 on the hammer 48 is adjusted by the cap 62. The tubular body provides a hand grip for the installer and its exterior may be knurled to provide a surface for the installer to grip. It should be understood that this tubular body could be attached to an assembly machine or could be a portion of an assembly machine and would serve as a grip for securing the inertial impact mechanism to the assembly machine.

When the shaft assembly is screwed to the tubular body 58, the plunger 50 initially retrains the hammer 48 against the action of the spring 60. The small pin 44 is received within the hole 52, but the plunger is offset relative to the axis of the shaft 42 so that the larger upper section shaft 43 does not fit within the hole 52. When a force is applied to the tool, the tool body 58 moves downward until a beveled or cam surface on the inside of the body 58 engages the rounded plunger end 55 to overcome the force exerted by the leaf spring 54. There are two different diameters on the inside of body 58 with a beveled transition that cams plunger end 55 to release it. As the plunger moves toward the leaf spring 54, the upper shaft portion 43 slides into the hole 52. The spring force exerted by coil spring 60 rams the hammer mass 48 downward exerting an impact force on the shaft 42 which is then delivered to the insertion head 10. Since this force is adjustable and the snap exerted by the tool is easily felt by the user, it provides a means for delivering a known force through the insertion head 10. The force delivered by the insertion head to the socket retention member is then not just a function of how hard the installer pushes on the tool. As long as the installer exerts enough force on the tool to cause the inertial impact mechanism to snap, a minimum insertion force is delivered to the socket. Since an installer will normally be repetitively mounting sockets, this action improves the reliability of the tool. The inertial impact mechanism also provides initial resistance so that the installer can feel to determine if the socket leads are aligned with the printed circuit board holes before snapping the tool.

Figure 6:
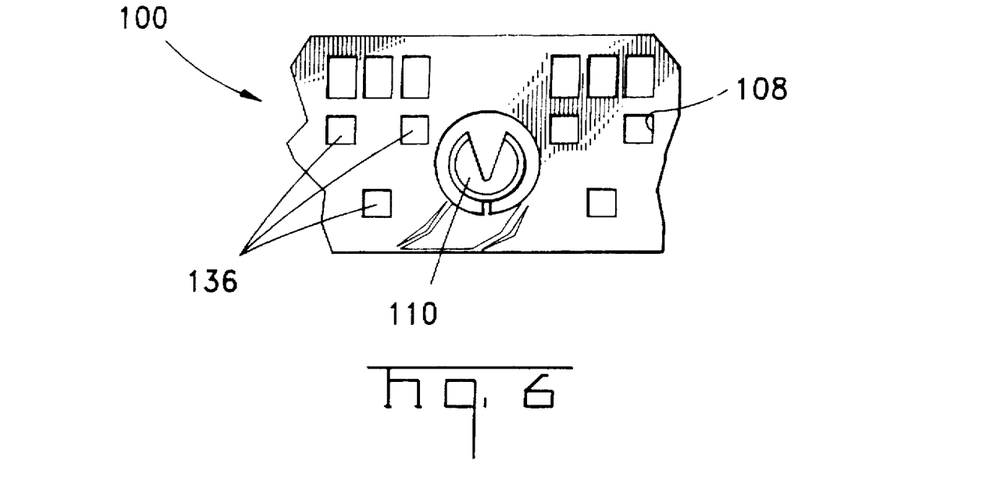
FIG. 6 is a partial view of the lower surface of an electrical connector with which the preferred embodiment of this insertion tool can be used. A center retention post on the connector and housing cavities through which terminal leads extend are shown.
Figure 7:
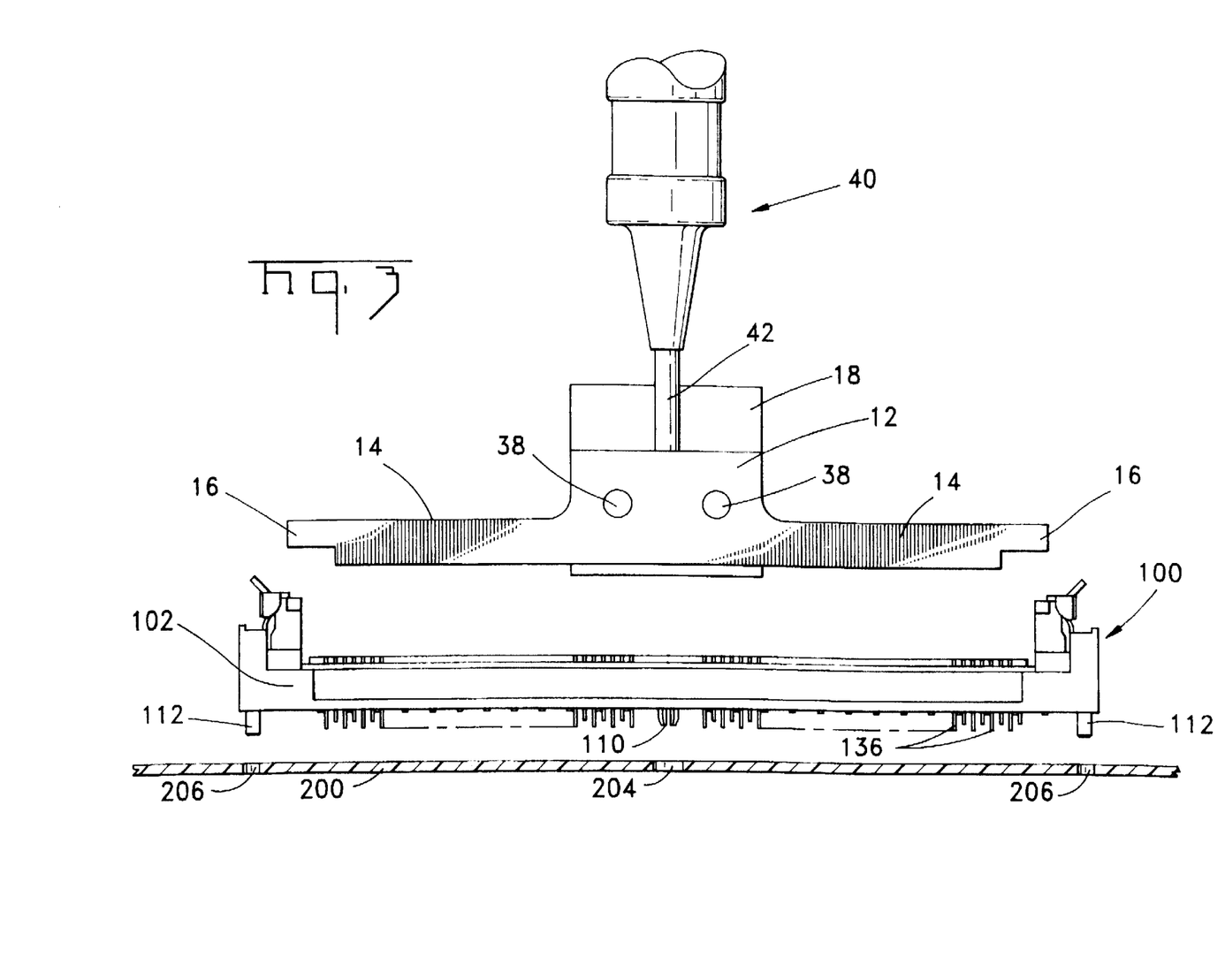
Figures 8, 9, 10:
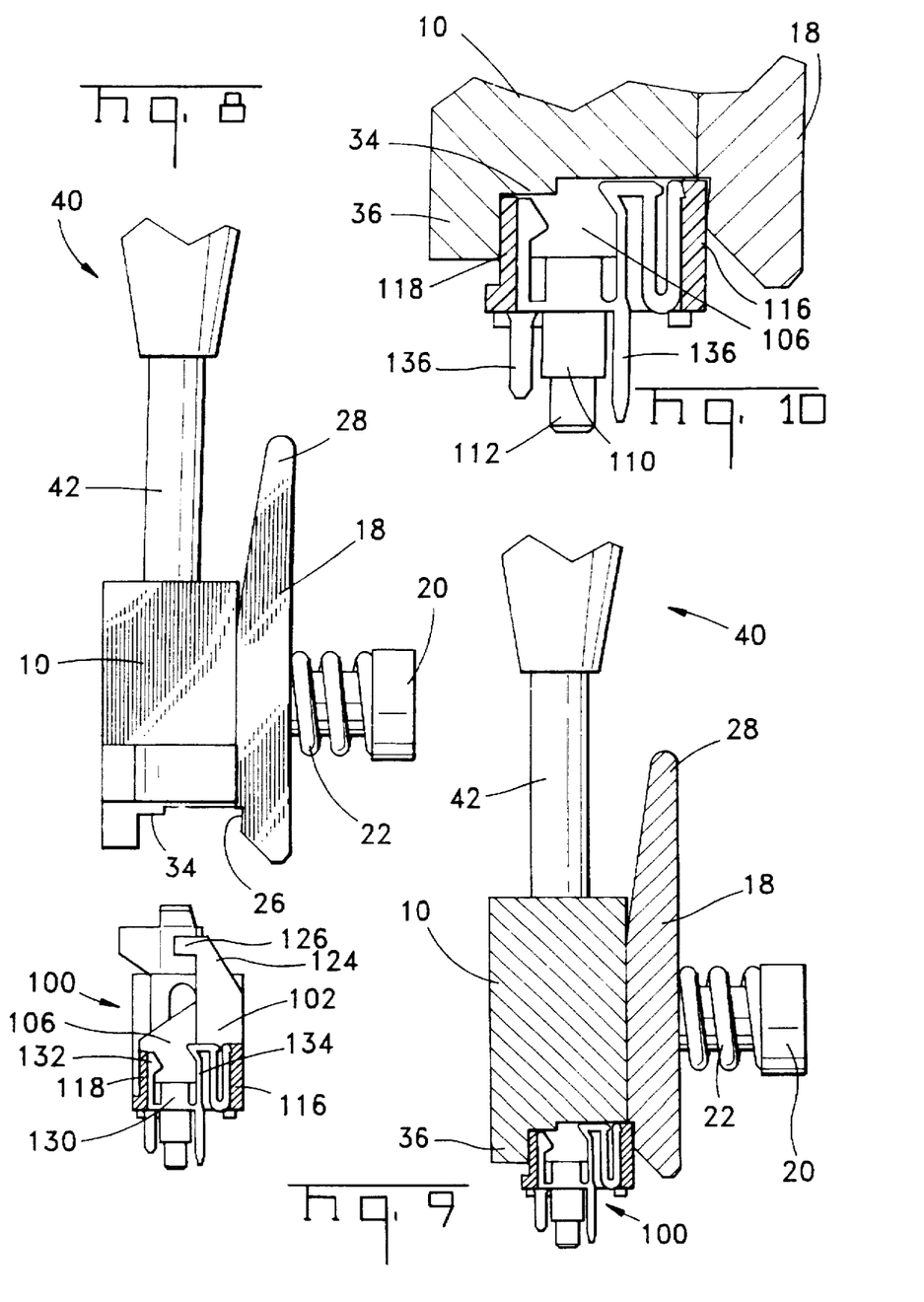
FIG. 8 is an exploded side view showing the tool insertion head and showing the electrical connector, partially in section, to reveal the terminals in the electrical connector.
FIG. 9 is a side view, partially in section, of the tool with the electrical connector mounted in the tool.
FIG. 10 is an enlarged view of the electrical connector and the portion of the tool insertion head engaging the electrical connector.

FIGS. 3-5 and 8-10 show the manner in which this insertion tool 2 is used with a SIMM socket 100. The preferred embodiment of this SIMM socket is manufactured and sold by AMP Incorporated and is identified as the AMP MICRO-EDGE SIMM socket, Part No. 822030-3. MICRO-EDGE is a trademark of the Whitaker Corporation. Additional details of the preferred embodiment of a SIMM socket with which this tool is used are shown in FIGS. 6 and 7. Socket 100 includes a socket housing 102 in which a number of side-by-side contact terminals 130 are positioned. Housing 102 includes a central socket base 104 with a channel 106 (See FIG. 10) extending between opposite ends of the base 104. Contact lead holes 108 extend through the lower surface of housing base 104 in a staggered configuration so that two rows of contact lead holes are formed for contact terminals 104 located in a single row. Contact terminals 130 include contact leads 136 extending from the bottom and adjacent contact terminals have offset leads. Contact terminals 130 are inserted into the housing through the top surface. Cavities or slots 114 are located on the top of the housing base 104 and are defined by ribs 116 and 118 on opposite sides of the channel 106. Each contact terminal 130 includes a stationary contact arm 132 and a deflectable contact arm 134 for engaging pads on a printed circuit board that provide the contact interface for a standard SIMM module. Stationary contact arms 132 are located in that portion of the contact cavities formed by relatively shorter ribs 118 and deflectable contact arms 134, being taller, are positioned between the relatively taller ribs 116.

The housing 102 also includes means for mounting the socket 100 on a printed circuit board 200 and means for retaining and supporting a standard SIMM module inserted into the channel 104 and into contact with terminals 130. A center retention post 110 is located on the bottom of the housing base 104. This retention post 110 establishes an interference fit with a corresponding mounting hole 204 on a printed circuit board 200. The retention post 110 depicted herein is cylindrical with a tapered slot extending inwardly from one side of the post 110. When the post is inserted into a mounting hole, the sides adjacent to the tapered slot are deformed inwardly and the stresses in the post retain the socket on the printed circuit board at least until the leads are soldered to the printed circuit board. Retention posts with radially extending ribs are also commonly used. Metal retention members or board locks may also be employed.

The socket housing also includes guide pins 112 located on opposite ends of the housing. These guide pins 112 are received with guide holes 206 on the printed circuit board 200. Guide pins 112 are longer than the retention post 110 and the contact leads 136 so that guide pins 112 serve to initially align the socket relative to the pattern of holes on the printed circuit board 200. The contact leads 136 are longer than the center retention post 110 so that the leads 136 enter through holes 202 prior to entry of the retention post 110 and prior to the time that sufficient force must be exerted to establish the interference fit of retention post 110 in hole 204. This allows the installer to detect, by feel, whether all of the leads 136 have been received in corresponding holes 202. A misaligned or bent lead 136 will exert sufficient resistance so that the installer can detect this resistance while holding the hand tool 2.

The socket housing 102 also includes upright SIMM module retention and support members 122 located on opposite ends of the housing base 104 that act in conjunction with metal latches 120 to position and secure the SIMM module in the socket 100. Each support includes an upright post 124 with a securing pin 126 that is received in a printed circuit board hole in a standard SIMM module. Upright posts 124 are located at the rear of the housing and are offset relative to the lateral centerline of the socket 100 and the channel 106. These offset upright posts 124 serve as a means to orient the socket 100 in the tool. When the socket 100 is mounted in the tool 2, the wings 16 on the insertion head 10 overlap the upright posts 124 so that the socket 100 can fit in the tool 2 in only one orientation.

To mount a socket 100 on a printed circuit board or motherboard 200, the installer first positions the socket 100 in the tool 2. The spring loaded clip 18 can be deflected outwardly to pick up the socket or the socket can be snapped in the tool. By using the spring loaded clip 18 to pick up the socket the installer can avoid handling the socket and damaging or bending the leads 136. With the socket 100 held in the insertion head 10 between the retention surface 26 on the spring loaded clip 18 and the front lip 36 and oriented by the wings 14, the installer then aligns the socket guide pins 112 with guide pin holes 206. Since the socket 100 is properly oriented relative to the tool 2, the installer can repetitively grip the tool 2 in one position, insuring that the front of the socket 100 will always face forward and eliminating lost motion and possible damage to the socket leads. As shown in FIG. 1 the tool does not interfere with a socket 100 mounted adjacent to the hole pattern receiving the socket in question. Therefore the sockets can be densely packed on the motherboard. The installer then moves the tool 2 toward the printed circuit board 200 until the leads 136 are initially inserted into corresponding holes 202. This movement does not require any appreciable force and if resistance is felt, the installer can feel the leads are misaligned before damaging the socket 100. After all of the leads are initially inserted in through holes, the center retention post 110 enters hole 204. At this point, force must be applied to the socket 100 through the tool 2. The installer pushes downward on the tool body 58 until the plunger 50 is shifted to release the hammer mass 48 delivering an impact force to the socket. For the preferred embodiment of the socket depicted herein an insertion force of at least nine (9) pounds must be exerted. Since the tool shaft 42 is positioned directly above the retention post 110, this impact force is delivered directly to the retention post. Preferably a support member 300 is positioned below the surface of the printed circuit board 200 to support the printed circuit board in the vicinity of the hole pattern receiving the socket. The lower surface of the insertion tool arms 14 is configured to fit against the upper surface of the socket 100 so the socket is supported between both ends. The insertion rib 34 is positioned to overlay the stationary contact arm 132 of contact terminals 130 on top of the shorter housing ribs 118. Rib 34 thus prevents the top loaded contacts from being forced out of the housing as the socket 100 is mounted on the printed circuit board 200. The tool 2 can then be pulled upward and the clip 18 will release the smooth side of the socket. Clip 18 can also be pressed to rotate it outward to release the socket, but since the clip does not extend under the socket it need not be spread outward by a distance that would interfere with adjacent sockets.

Although the preferred embodiment of this invention has been described with reference to use with top loaded SIMM sockets, the invention is not restricted to use with one version of an electrical connector. For example, this tool can be used with other sockets or connectors and is especially useful for sockets that use top loaded contacts that might be forced out of the connector housing when mounted on a printed circuit board. The invention is especially useful in a low cost hand tool, but can also be adapted by one of ordinary skill in the art to assembly machines and pick and place equipment. A tool employing an adjustable inertial impact mechanism could also be used where excessive force applied to the socket or the printed circuit board could cause damage. Since the inertial impact tool delivers a prescribed force a tool of this type could be employed to prevent an installer from pushing too hard and damaging the assembly. For example this approach could prevent damage to surface mount leads in some applications. The invention as defined by the following claims is therefore not limited to the sole embodiment depicted herein but is applicable to equivalent devices and methods suggested to one of ordinary skill in the art.

We claim:

1. A tool for installing an electrical connector on a circuit board, wherein the electrical connector includes a housing having a lower surface to be mounted adjacent to the circuit board, a plurality of electrical terminals disposed in cavities in the housing, the cavities being open to a top surface of the housing, the tool comprising:

an insertion head including a lower surface configured to conform to the top surface of the electrical connector housing, the insertion head having laterally extending arms and a wing extending from each of the arms, the wings comprising orientation means for engaging the electrical connector in only one orientation; and a shaft connected to the insertion head for delivering a force transmitted through the shaft to the insertion head.

2. The tool of claim 1 wherein the electrical connector housing has upright support posts at opposite ends, the upright support posts being laterally offset from a centerline of the housing, the wings at opposite ends of the insertion head being laterally offset relative to a centerline of the insertion head, the wings overlapping the upright support posts when the insertion head is applied to the housing so that the insertion head can only be applied to the housing in the one orientation.

3. The tool of claim 1 wherein the shaft is connected to a center of the insertion head.

4. The tool of claim 1 wherein the insertion head includes a laterally extending rib that is configured to overlie the electrical terminals.

5. The tool of claim 4 wherein a lip extends from one side of the lower surface of the insertion head, the lip is parallel to the rib and is configured to support a side surface of the electrical connector.

6. The tool of claim 5 wherein a connector gripping member extends from the insertion head on an opposite side from the lip so that the connector gripping member and the lip are opposed.

7. The tool of claim 6 wherein the connector gripping member is spring loaded.

8. The tool of claim 7 wherein the spring loaded connector gripping member includes a projecting section for rocking the gripping member outward for insertion and release of the electrical connector.

9. The tool of claim 1 wherein an inertial impact mechanism is attached to the shaft for delivering an impact force through the shaft to the insertion head.

* * * * *